US012571128B2

(12) United States Patent
Ivanov et al.

(10) Patent No.: US 12,571,128 B2
(45) Date of Patent: Mar. 10, 2026

(54) CHEMICAL VAPOR DEPOSITION GROWTH OF HEXAGONAL BORON NITRIDE FILMS AND NANOSTRUCTURES

(71) Applicant: UT-Battelle, LLC, Oak Ridge, TN (US)

(72) Inventors: Ilia N. Ivanov, Oak Ridge, TN (US); Ivan V. Vlassiouk, Oak Ridge, TN (US); Dayrl P. Briggs, Oak Ridge, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 172 days.

(21) Appl. No.: 18/369,370

(22) Filed: Sep. 18, 2023

(65) Prior Publication Data

US 2025/0092571 A1 Mar. 20, 2025

(51) Int. Cl.
  *C30B 25/12* (2006.01)
  *C30B 25/16* (2006.01)
  (Continued)

(52) U.S. Cl.
  CPC ............ *C30B 29/403* (2013.01); *C30B 25/12* (2013.01); *C30B 25/165* (2013.01); *C30B 28/14* (2013.01); *C30B 29/602* (2013.01); *C30B 29/64* (2013.01)

(58) Field of Classification Search
  CPC ....... C23C 16/34; C23C 16/46; C23C 16/342; C23C 16/52; C23C 16/45563;
  (Continued)

(56) References Cited

U.S. PATENT DOCUMENTS 10,023,468 B2 7/2018 Vlassiouk et al.
10,233,566 B2 3/2019 List, III et al.
(Continued)

FOREIGN PATENT DOCUMENTS

CN 103031516 A * 4/2013

OTHER PUBLICATIONS

Seo et al., Synthesis of boron nitride nanotubes using thermal chemical vapor deposition of ball milled boron powderJournal of Industrial and Engineering Chemistry (Year: 2013) pp. 1117-1122.*
(Continued)

*Primary Examiner* — Robert M Kunemund
(74) *Attorney, Agent, or Firm* — WARNER NORCROSS + JUDD LLP

(57) ABSTRACT

A scalable method of synthesizing hexagonal boron nitride (hBN) films and nanotubes by chemical vapor deposition (CVD) is provided. The method includes atmospheric pressure CVD of hBN on metallic growth substrates using solid boron sources and molecular nitrogen. The solid boron source can be in the form of powder, fragments, or platelets and placed upstream, on top, or below the growth substrate. The growth substrate can include Fe, Ni, Cr, Cu, and their alloys including various steels. The growth atmosphere includes nitrogen compounds, inert gases and hydrogen. The reaction can occur within a reaction vessel heated to 800° C.-1200° C. in less than 120 minutes with sequential cooling at a controlled rate. In laboratory testing, the hBN film exhibited improved protection against harsh corrosion over long periods and resistance to high-temperature oxidation in air.

25 Claims, 5 Drawing Sheets

(51) Int. Cl.
  *C30B 28/14*     (2006.01)
  *C30B 29/40*     (2006.01)
  *C30B 29/60*     (2006.01)
  *C30B 29/64*     (2006.01)

(58) Field of Classification Search
  CPC ....... C30B 25/02; C01B 21/046; C01B 35/14;
                C01B 35/583; C04B 35/583
  See application file for complete search history.

(56)                        References Cited

U.S. PATENT DOCUMENTS

| | | | |
|---|---|---|---|
| 2009/0253248 | A1 | 10/2009 | Sun et al. |
| 2019/0093217 | A1 | 3/2019 | Loeblein et al. |
| 2020/0017361 | A1 | 1/2020 | Liu et al. |
| 2020/0216317 | A1 | 7/2020 | Kim et al. |
| 2021/0363010 | A1 | 11/2021 | Shi et al. |
| 2022/0009779 | A1 | 1/2022 | Eshon et al. |
| 2022/0098043 | A1 | 3/2022 | Arliguie et al. |
| 2023/0048057 | A1 | 2/2023 | Hong et al. |

OTHER PUBLICATIONS

International Search Report and the Written Opinion of the International Searching Authority for App. No. PCT/US2024/046842, mailed Oct. 31, 2024 (15 pages).

* cited by examiner hBN multilayer grown on Fe foil

300nm

1μm hBN monolayer grown on Ni thin film

CHEMICAL VAPOR DEPOSITION GROWTH OF HEXAGONAL BORON NITRIDE FILMS AND NANOSTRUCTURES

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF THE INVENTION

The present invention relates to the synthesis of hexagonal boron nitride including boron nitride films and boron nitride nanostructures.

BACKGROUND OF THE INVENTION

Hexagonal boron nitride (hBN) has emerged as a foundational two-dimensional material with a flat layered structure, chemical inertness, and a large thermal stability window similar to that of graphene, yet with an ultra-wide bandgap (e.g., about 6 eV). These attributes are attractive for a range of technical applications. In addition to use as a substrate, gate dielectric, interlayer or encapsulating insulator, and an active material in electronic, photonic, and quantum devices, hBN can also be used as a superior protective layer by preventing corrosion, offering high-temperature oxidation resistance, inhibiting scale formation, and reducing friction.

The prevailing source for hBN devices includes exfoliated flakes from hBN crystals that are synthesized by the slow cooling of fluxes containing boron and nitrogen precursors. This crystal growth is time consuming (>24 hours) and requires high temperature furnaces (>1500° C.). In comparison, chemical vapor deposition (CVD) can produce much larger hBN films. However, hBN produced by CVD typically possesses inferior quality as compared to exfoliated examples.

More recently, large-scale crystal samples of mono-layer and few-layer hBN have been grown on specially engineered Au, Cu, Ni, and NiFe substrates using borazine (liquid) or ammonia borane (solid) as a precursor. However, using these precursors is challenging not only due to safety and cost, but their decomposition is also difficult to control in a large reactor, as the B:N ratio changes over the reactor length despite using a precursor with the initial 1:1 ratio. This complicates the growth process, especially in large reactors, enough to evoke machine learning for process optimization. More conventional precursors, including a mixture of diborane and ammonia, have also been investigated, but the results are even less encouraging, as uncontrollable deposition of various BN particles and polymers within the CVD reactor were observed. These precursors are also toxic, which introduces safety issues into the logistics of scalable synthesis.

Accordingly, there remains a continued need for an improved method for the synthesis of hBN. In particular, there remains a continued need for the scalable synthesis of high quality hBN films and nanostructures with minimal hazardous byproducts.

SUMMARY OF THE INVENTION

A scalable method of synthesizing hBN films and nanostructures by CVD is provided. The method includes CVD of hBN on metallic growth substrates using solid boron sources and a nitrogen-containing reaction gas mixture. The solid boron sources can include powders, fragments, or platelets and placed upstream, on top, or below the growth substrate. The growth substrate can include Fe, Ni, Cr, Cu, and their alloys including various steels, stainless steels, permalloys, Invar, super-Invar, Kovar, Inconels, and others. The reaction gas mixture includes nitrogen compounds, for example molecular nitrogen, and hydrogen gas. The reaction can occur within a reaction vessel heated to 800° C.-1200° C. in less than 120 minutes with cooling at a controlled rate. In laboratory testing, hBN films exhibited improved protection against harsh corrosion over long periods and resistance to high-temperature oxidation in air.

In one embodiment, a method of synthesizing hBN films is provided. The method includes positioning a solid boron precursor and a growth substrate within a chemical vapor deposition chamber. The solid boron precursor can include boron powders, boron fragments, or boron platelets that do not directly contact the growth substrate. The growth substrate includes nickel, iron, copper, chromium, or alloys thereof. The method further includes heating an interior of the chemical vapor deposition chamber to between 800° C. and 1200° C., inclusive, and flowing a nitrogen-containing reaction gas mixture into the chemical vapor deposition chamber. Nitrogen in the reaction gas mixture reacts with boron released from the solid boron precursor to form single-layer or multi-layer hexagonal boron nitride film on the growth substrate.

In another embodiment, a method of synthesizing BN nanotubes is provided. The method includes positioning a solid boron precursor and metallic nanoparticles within a chemical vapor deposition chamber, wherein the solid boron precursor does not directly contact the metallic nanotubes. The metallic nanoparticles can be formed according to any desired method, including for example by dewetting a metallic film having a thickness less than 100 nm at a temperature greater than 800° C. The method further includes heating an interior of the chemical vapor deposition chamber to between 800° C. and 1200° C., inclusive, and flowing a nitrogen-containing reaction gas mixture into the chemical vapor deposition chamber. Nitrogen in the reaction gas mixture reacts with boron released from the solid boron precursor to form boron nitride nanotubes having a mean diameter of between 0.5 nm and 100 nm, inclusive.

As discussed herein, the present invention provides a scalable approach for the synthesis of hBN films and nanostructures using solid boron sources, including elemental boron, boron oxide, boron carbide, and various metallic borides such as iron boride, nickel boride, and magnesium diboride. In laboratory testing, synthesized hBN films exhibited improved protection against corrosion and oxidation. The present invention uses abundant and benign precursors and makes economical new large-scale industrial applications for hBN coatings as a versatile protective layer for metal alloys.

These and other features and advantages of the present invention will become apparent from the following description of the invention, when viewed in accordance with the accompanying drawings and appended claims.

BRIEF DESCRIPTION OF THE DRAWINGS

FIG. 3 includes characteristic SEM images of hBN multilayer (top) and monolayer (bottom) synthesized in accordance with the method of the present invention.

DETAILED DESCRIPTION OF THE CURRENT EMBODIMENTS

As discussed herein, the current embodiments relate to a method of synthesizing hBN films and nanostructures by CVD. The method generally includes the synthesis of hBN on metallic growth substrates using solid boron sources, including elemental boron, boron oxide, boron carbide, various metallic borides such as iron boride, nickel boride, or magnesium diboride, and a nitrogen-containing reaction gas mixture. The solid boron sources can include powders, fragments, or platelets that are placed upstream, on top, or below the growth substrate. The reaction gas mixture includes nitrogen compounds, for example molecular nitrogen or ammonia, and inert gases and hydrogen gas. The resulting hBN provides improved protection against corrosion over long periods and excellent resistance to high-temperature oxidation.

Figure 1:
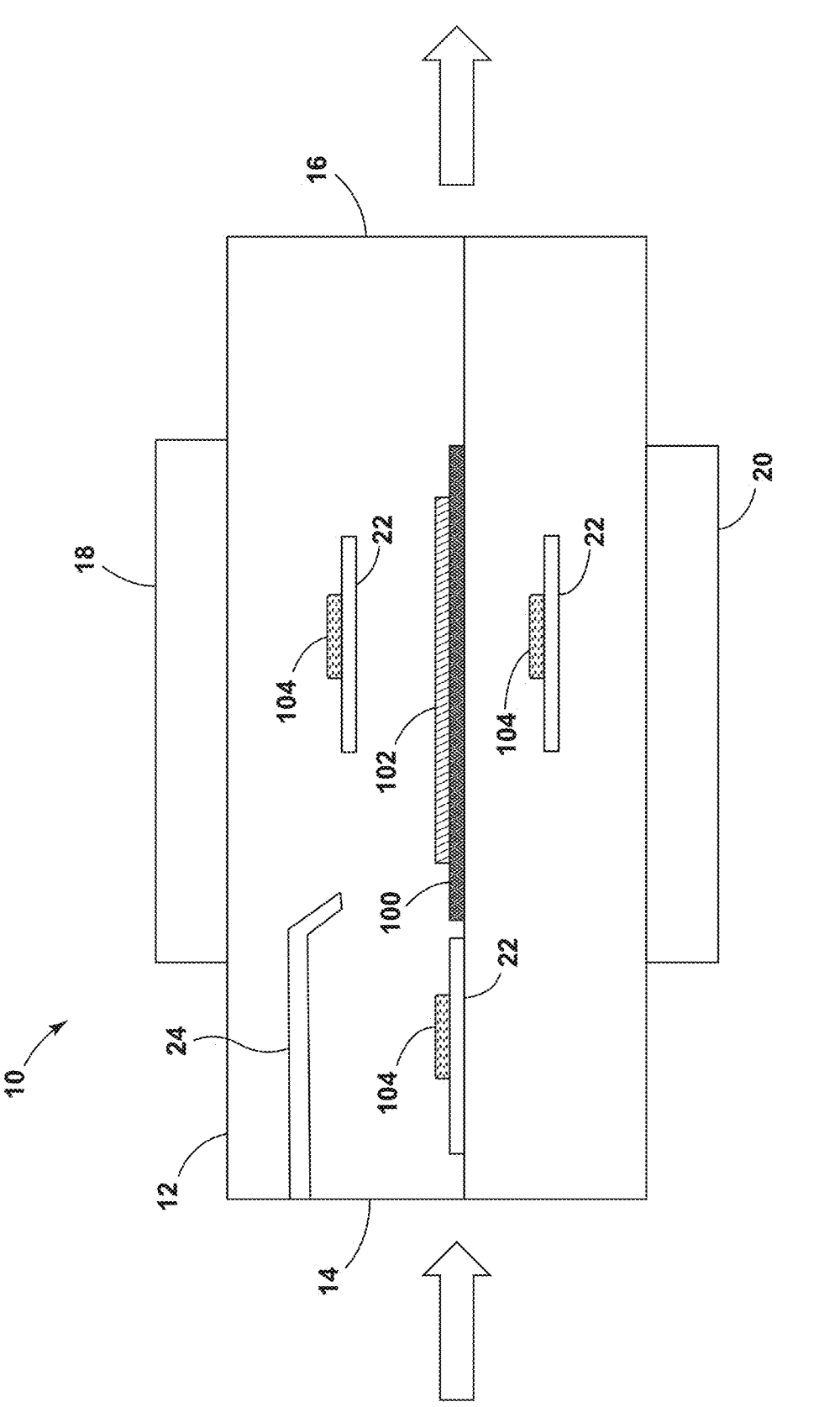
FIG. 1 is a schematic diagram of a chemical vapor deposition chamber for the controlled synthesis of hBN films or nanotubes.

Referring now to FIG. 1, a schematic diagram of a CVD chamber is illustrated and generally designated 10. The CVD chamber 10 includes a reactor housing 12 having an inlet 14 for the in-flow of a growth substrate 100 and an outlet 16 for the out-flow of a growth substrate 100 having a newly formed hBN thin film 102. External heating elements 18, 20 (e.g., resistive, electromagnetic, and/or inductive) heat the growth substrate 100 to a preselected temperature within the CVD chamber 10, optionally a temperature of between 800° C. and 1200° C., inclusive. For example, the heating elements 18, 20 can include resistive elements that are positioned on opposite sides of the CVD chamber 10. Alternatives include inductive heating or a plasma arc lamp or infrared lamps. The CVD chamber 10 also includes a quartz support 22 for supporting solid boron precursors 104 and supply nozzle 24 for delivering a reaction gas mixture. The supply nozzle 24 can include a conduit connected at one end with one or more sources of a reaction gas.

In accordance with one embodiment, a method for synthesizing hBN films includes, first, positioning a growth substrate 100 in the chemical vapor deposition chamber 10. The growth substrate 100 is depicted as a standalone substrate in FIG. 1 but can be a continuous substrate that is unwound from a supply reel and optionally wound onto a take-up reel after hBN synthesis. The growth substrate 100 can include nickel, iron, copper, chromium, or alloys thereof such as various steels, stainless steels, permalloys, Invar, super-invar, Kovar, Inconel and others, by non-limiting example. Further optionally, the growth substrate 100 can include a film having a thickness of between 0.1 μm and 5.0 μm, inclusive, a foil having a thickness of between 5.0 μm and 150 μm, inclusive, or a sheet having a thickness of between 0.15 mm and 5 mm, inclusive, or a plate having a thickness of 5 mm to 100 mm, inclusive.

The method also includes positioning a boron precursor 104 within the CVD chamber 10, including for example elemental boron (B), boron oxide ($B_2O_3$), or boron carbide ($B_4C$) or various metallic borides such as iron boride, nickel boride, or magnesium diboride. The boron precursor 104 is provided in the solid phase and can include powders, fragments, and/or platelets that do not directly contact the growth substrate 100. Instead, the boron precursor 104 is supported by one or more quartz supports 22 that sit above, below, and/or offset from the growth substrate 100. The boron-containing powders can have a mean diameter of between 0.1 μm and 1000 μm, inclusive, while the boron-containing fragments (including chunks and pieces) can include a mean diameter of between 1 mm and 100 mm, inclusive. Where the boron precursor 104 is a plate, the plate can have a thickness of greater than 5 mm, by non-limiting example.

The method then includes flowing a reaction gas mixture into the CVD chamber 10 and increasing the temperature within the CVD chamber 10 to desired levels. The reaction gas mixture includes a nitrogen-containing compound, for example, molecular nitrogen ($N_2$) or ammonia ($NH_3$). The reaction gas mixture also includes hydrogen gas ($H_2$) and an inert (buffer) gas, for example argon (Ar). The reaction gas mixture can be maintained at atmospheric pressure in some embodiments, while in other embodiments the reaction gas mixture can be maintained at any pressure between 10 mTorr and 800 Torr, inclusive. The reaction gas mixture can optionally include a partial pressure ratio of molecular nitrogen to hydrogen of greater than 30 ($P_{N2}/P_{H2} > 30$). Further optionally, the reaction gas mixture can include a partial pressure ratio of ammonia to hydrogen of greater than 30 ($P_{NH3}/P_{H2} > 30$). The inert gas can include other than argon (for example, helium) and can be used to maintain atmospheric pressure within the CVD chamber 10.

As noted above, the CVD chamber 10 is heated to promote synthesis of hBN. For example, the interior of the CVD chamber 10 can be heated to between 800° C. and 1200° C., inclusive, further optionally about 900° C., 1000° C., or 1100° C. for a growth period of about 30 minutes to 60 minutes before slow cooling or fast cooling to about 200° C. During the growth period, the growth substrate 100 reacts with boron released from the boron precursor 104 and the nitrogen compound to form single-layer or multi-layer hBN film. The hBN film can be moved to a transfer substrate according to any suitable method. For example, PMMA can be spin coated onto the hBN film and heated atop a hot plate. Thereafter, the growth substrate 100 can be dissolved using an appropriate etchant and the hBN-PMMA device can be washed in deionized water before being transferred onto a suitable wafer, for example a $SiO_2$/Si wafer. The PMMA top coat can then be removed chemically, optionally by acetone treatment.

The foregoing method can also be used to synthesize hBN nanotubes. For example, hBN can be synthesized into nanotubes substantially as set forth above. The metallic nanoparticles can include nickel, iron, copper, chromium, or alloys thereof. The metallic nanoparticles are optionally formed by dewetting a metallic film having a thickness less than 100 nm at a temperature greater than 800° C., by non-limiting example. The metallic nanoparticles are supported within the CVD chamber 10 above, below, and/or offset from the growth substrate. The reaction gas mixture and the CVD process parameters (vessel pressure, partial pressure, temperature) are otherwise identical to the CVD process parameters described above in connection with the growth of hBN films on flat metallic substrates (films, foils, and plates).

To reiterate, the method of the present invention provides a scalable method for atmospheric CVD growth of hBN using gaseous molecular nitrogen/ammonia and various forms of solid boron (B, $B_2O_3$, or $B_4C$) and various metallic borides such as iron boride, nickel boride or magnesium diboride as precursors, which are abundant, benign, and convenient-all necessary traits for large-scale industrial production. Catalytic hBN growth can be extended to an industrial scale, limited only by the reactor size, allowing coatings on various industrial metal items such as stainless steels 304 and 316, mild steels, cupronickels, and Inconel.

The present invention is further described in connection with the following laboratory examples, which are intended to be non-limiting.

Figure 2:
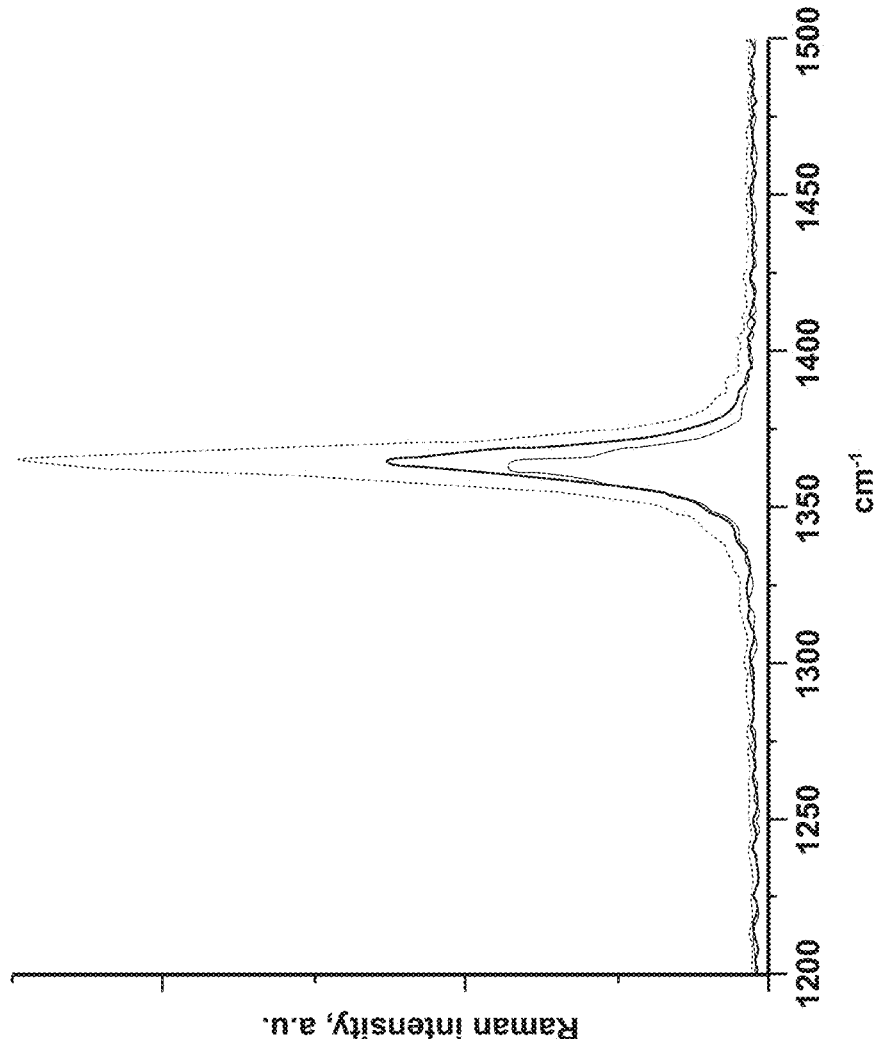
FIG. 2 includes a characteristic Raman spectra of hBN synthesized in accordance with the method of the present invention.
Figure 3:
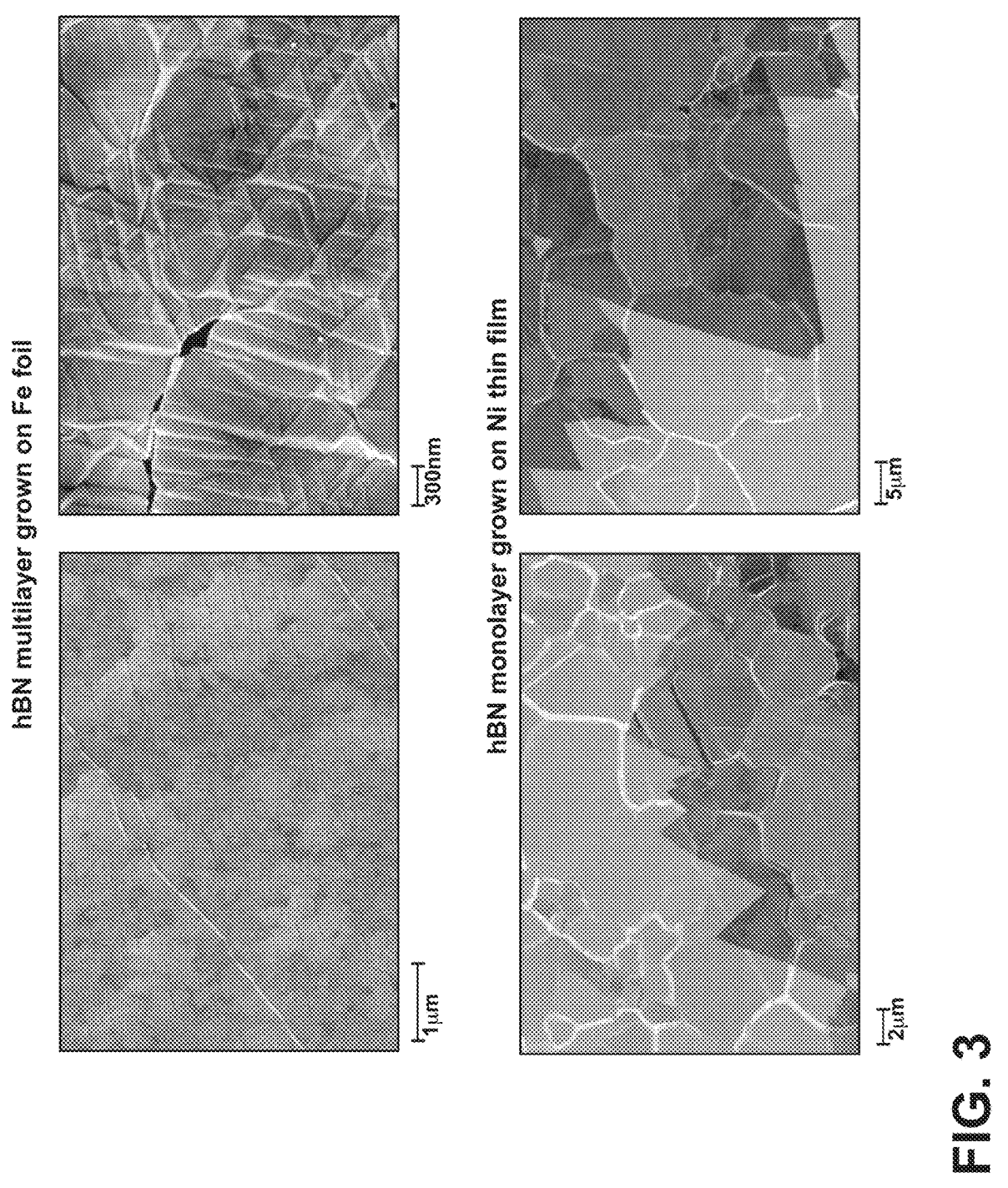
Figure 4:
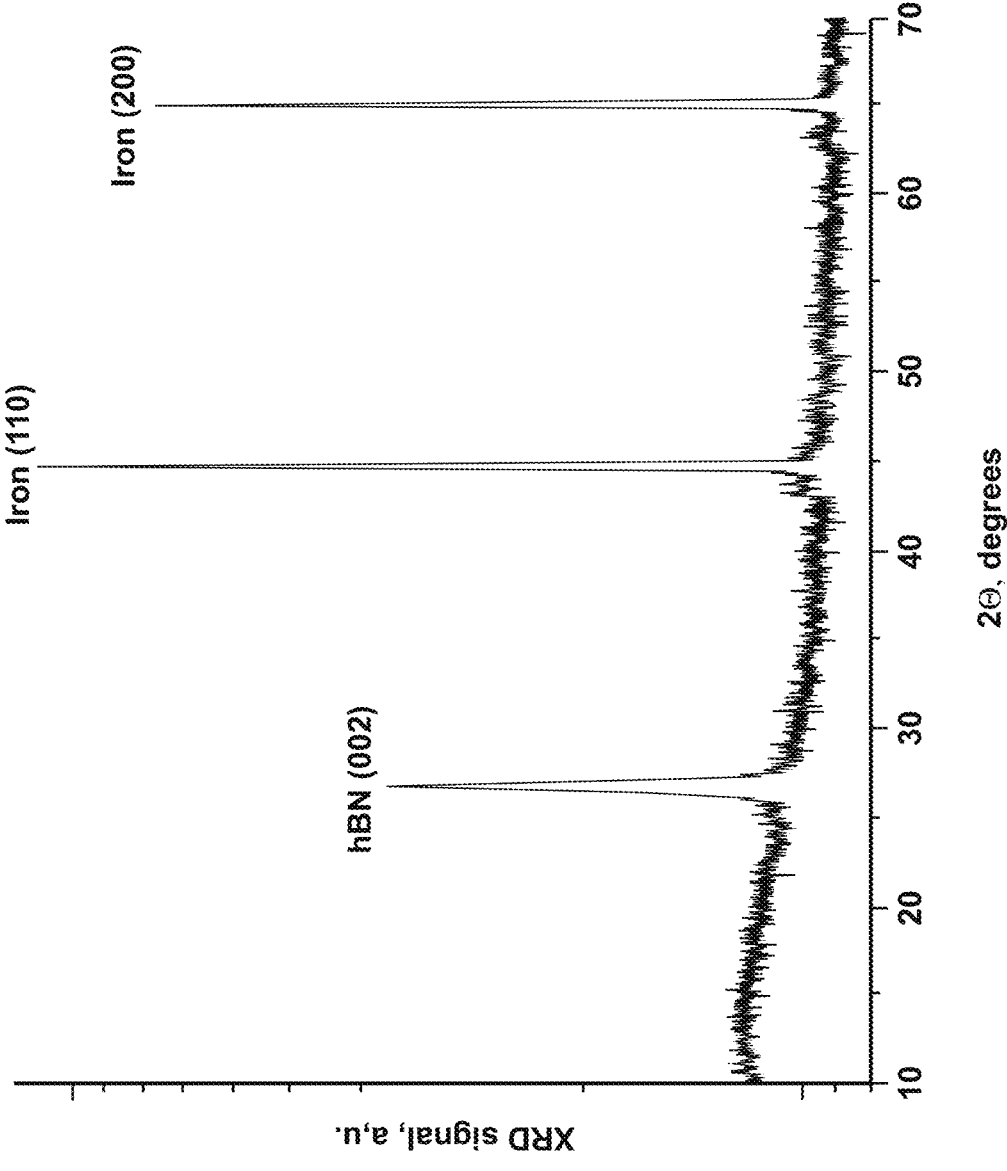
FIG. 4 includes a characteristic XRD graph of hBN grown on Fe foil in accordance with a non-limiting example of the present invention.

The following growth substrates were loaded into a CVD chamber for the synthesis of single layer, few-layer, and multi-layer hBN: 1-5 mil thick 99.99% pure iron foil, 0.4-5 mil thick 99.99% pure nickel foil, and 0.3-1 μm pure nickel or iron thin film. Boron fragments were placed on a quartz support above the growth substrates. 1000 sccm of $N_2$, 1000 sccm of Ar, and 25 sccm of $H_2$ were introduced into the CVD reactor, and the CVD reactor was heated to 1100° C. Growth was performed for 30 minutes with a subsequent fast cool to room temperature (200° C./min). The samples exhibited a Raman spectra having a single narrow line around 1370 $cm^{-1}$, shown in FIG. 2, which is characteristic of a high quality hBN film. SEM images of hBN multilayer and monolayer films are shown in FIG. 3 for different growth substrates. The hBN multi-layer films (top) exhibited characteristic film wrinkles and thick triangular crystals, while the hBN single-layer crystals (bottom) are distinguished by the darker contrast. As also shown in FIG. 4, characteristic x-ray diffraction (XRD) analysis of hBN multi-layer growth on an Fe growth substrate includes a BN peak at approximately 27 degrees.

Figure 5:
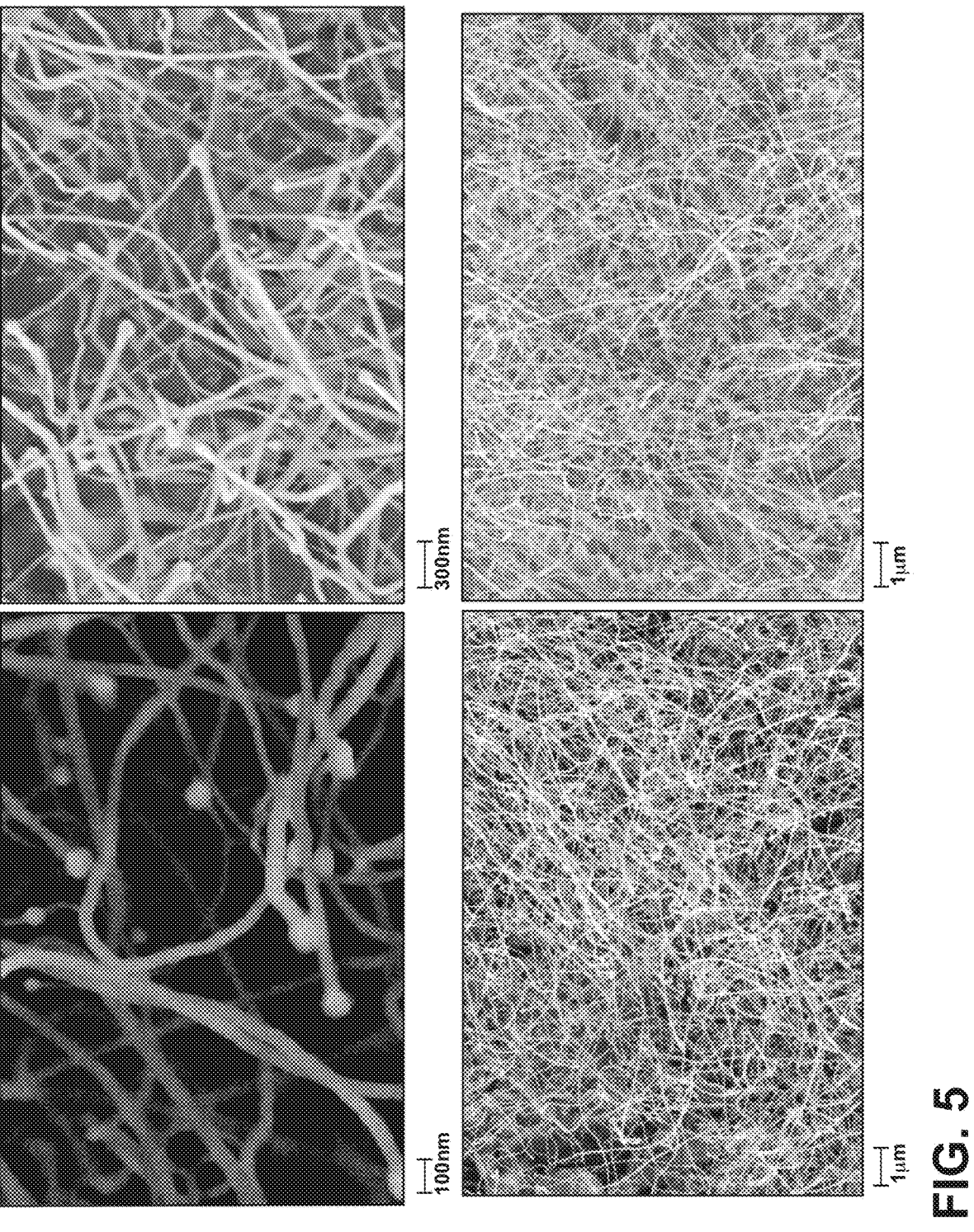
FIG. 5 includes SEM images of BN nanotubes grown in accordance with the present invention using solid boron and molecular nitrogen and hydrogen as precursors.

In a further example, Fe nanoparticles were prepared by dewetting an iron film having a thickness of less than 100 nm at 1000° C. The prepared nanotubes included a mean diameter of between 0.5 and 100 nm and were introduced into the CVD chamber with the reaction gas mixture and processing parameters of the above example (1000 sccm of $N_2$, 1000 sccm of Ar, and 25 sccm of $H_2$, 1100° C., 30 minutes). SEM images of the synthesized BN nanotubes are shown in FIG. 5, which as noted above used molecular nitrogen and hydrogen as precursors.

In still a further example, the growth substrate included a 500 nm thick metal film (Ni—Fe) deposited atop a $SiO_2/Si$ wafer. A cm-sized boron piece was placed atop a quartz support above the growth substrate, such that the boron did not contact the growth substrate directly. Upon heating within a nitrogen-containing reaction gas mixture, boron species were released, and their concentrations declined with distance from the boron piece, while nitrogen concentrations stayed constant throughout the CVD reactor. Hexagonal BN formed on the growth substrate closest to the boron source, where concentrations of boron were sufficiently high. In further analysis, it was determined that the width of the hBN deposition zone did not depend on the hydrogen partial pressure ($P_{H2}$). Instead, the width of the hBN deposition zone depended almost linearly on the nitrogen partial pressure ($P_{N2}$), while the dilution of nitrogen by argon allowed maintaining atmospheric pressure within the CVD chamber. Such a dependence suggests that dissociative adsorption of molecular nitrogen on the growth substrate is a rate limiting step. Further analysis indicated that lower temperatures (e.g., 900° C. rather than 1100° C.) resulted in larger yields.

In a further example, cold-wall synthesis using a boron disk (3 inch diameter, 0.125 inches thick) was performed in a 4-inch FirstNano EasyTube furnace. The furnace was evacuated to 0.1 Torr and filled with process gases. Conditions for hBN growth included the following: 1100° C., 1000 sccm total flow of $N_2$ and Ar, 25 sccm of $H_2$. Partial pressures of $N_2$, $H_2$, and Ar were controlled by the base flow ratios, thereby maintaining atmospheric pressure. Heating to the targeted temperature was performed in about one minute, and the growth of hBN film was performed for thirty minutes to an hour, after which the heating power was turned off. The growth sample cooled to 200° C. in about five minutes. Hot wall synthesis included suspending a boron disk over a metallic substrate. During heating, 2000 sccm of Ar and 50 sccm of $H_2$ were flowed until synthesis temperature was reached (approximately 25 minutes), after which time Ar was substituted by $N_2$ and growth proceed for approximately 30 minutes. After growth, the furnace was opened (fast cool) or controllably cooled with about 5° C./min to 800° C. (slow cool).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. A method of synthesizing hexagonal boron nitride, the method comprising:
   positioning a solid boron-containing precursor and a continuous growth substrate within a chemical vapor deposition chamber, wherein the solid boron-containing precursor includes boron powders, boron fragments, or boron platelets and does not directly contact the continuous growth substrate, wherein the continuous growth substrate includes nickel, iron, copper, chromium, or alloys thereof, and wherein the continuous growth substrate is unwound from a supply reel;
   heating an interior of the chemical vapor deposition chamber to between 800° C. and 1200° C., inclusive;
   flowing a nitrogen-containing reaction gas mixture into the chemical vapor deposition chamber, the reaction gas mixture including a nitrogen compound and hydrogen gas, wherein the reaction gas mixture is pressurized between 10 mTorr and 800 Torr, inclusive, wherein the reaction gas mixture includes a ratio of a partial pressure of nitrogen to a partial pressure of hydrogen of greater than 30, and wherein the continuous growth substrate reacts with boron released from the solid boron-containing precursor and the nitrogen compound to form a single-layer or multi-layer hexagonal boron nitride film on the continuous growth substrate; and taking up the continuous growth substrate onto a take-up reel after formation of the hexagonal boron nitride film on the continuous growth substrate.

2. The method of claim 1, wherein the nitrogen compound comprises molecular nitrogen ($N_2$).

3. The method of claim 1, wherein the nitrogen compound comprises ammonia ($NH_3$).

4. The method of claim 1, wherein the reaction gas mixture includes a concentration of between 0.01% and 25% of hydrogen gas ($H_2$).

5. The method of claim 1, wherein the solid boron-containing precursor is supported above the continuous growth substrate.

6. The method of claim 1, wherein the solid boron-containing precursor is supported below the continuous growth substrate.

7. The method of claim 1, wherein the solid boron-containing precursor is supported laterally adjacent to the continuous growth substrate.

8. A method of synthesizing hexagonal boron nitride, the method comprising:

positioning a solid boron-containing precursor and a growth substrate within a chemical vapor deposition chamber, wherein the solid boron-containing precursor includes boron powders, boron fragments, or boron platelets and does not directly contact the growth substrate, and wherein the growth substrate includes nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, wherein the growth substrate reacts with boron released from the solid boron-containing precursor and the nitrogen compound to form a single-layer or multi-layer hexagonal boron nitride film, and wherein the growth substrate comprises a film having a thickness of between 0.1 μm and 5.0 μm, inclusive.

9. A method of synthesizing hexagonal boron nitride, the method comprising:

positioning a solid boron-containing precursor and a growth substrate within a chemical vapor deposition chamber, wherein the solid boron-containing precursor includes boron powders, boron fragments, or boron platelets and does not directly contact the growth substrate, and wherein the growth substrate includes nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, wherein the growth substrate reacts with boron released from the solid boron-containing precursor and the nitrogen compound to form a single-layer or multi-layer hexagonal boron nitride film, and wherein the growth substrate comprises a foil having a thickness of between 5.0 μm and 150 μm, inclusive.

10. A method of synthesizing hexagonal boron nitride, the method comprising:

positioning a solid boron-containing precursor and a growth substrate within a chemical vapor deposition chamber, wherein the solid boron-containing precursor includes boron powders, boron fragments, or boron platelets and does not directly contact the growth substrate, and wherein the growth substrate includes nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, wherein the growth substrate reacts with boron released from the solid boron-containing precursor and the nitrogen compound to form a single-layer or multi-layer hexagonal boron nitride film, and wherein the growth substrate comprises a sheet having a thickness of between 0.15 mm and 5 mm, inclusive.

11. A method of synthesizing hexagonal boron nitride, the method comprising:

positioning a solid boron-containing precursor and a growth substrate within a chemical vapor deposition chamber, wherein the solid boron-containing precursor includes boron powders, boron fragments, or boron platelets and does not directly contact the growth substrate, and wherein the growth substrate includes nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, wherein the growth substrate reacts with boron released from the solid boron-containing precursor and the nitrogen compound to form a single-layer or multi-layer hexagonal boron nitride film, and wherein the growth substrate comprises a plate having a thickness of between 5 mm and 100 mm, inclusive.

12. A method of synthesizing hexagonal boron nitride, the method comprising:

positioning a solid boron-containing precursor and a growth substrate within a chemical vapor deposition chamber, wherein the solid boron-containing precursor includes boron powders, boron fragments, or boron platelets and does not directly contact the growth substrate, and wherein the growth substrate includes nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, wherein the growth substrate reacts with boron released from the solid boron-containing precursor and the nitrogen compound to form a single-layer or multi-layer hexagonal boron nitride film, and wherein the growth substrate comprises includes a three-dimensional geometry including at least one of nails, tubes, and ball bearings.

13. The method of claim 1, wherein the solid boron precursor includes elemental boron (B), boron oxide ($B_2O_3$), or boron carbide ($B_4C$).

14. The method of claim 1, wherein the solid boron-containing precursor includes metal borides such as iron borides ($Fe_xB$), nickel boride ($Ni_xB$) and magnesium diboride ($MgB_2$).

15. A method of synthesizing boron nitride nanotubes, the method comprising:

positioning a solid boron-containing precursor and metallic nanoparticles within a chemical vapor deposition chamber, wherein the solid boron-containing precursor includes boron powders, boron fragments, or boron platelets and does not directly contact the metallic nanotubes, and wherein the metallic nanoparticles include nickel, iron, copper, chromium, or alloys thereof;

heating an interior of the chemical vapor deposition chamber to between 800° C. and 1200° C., inclusive; and flowing a nitrogen-containing reaction gas mixture into the chemical vapor deposition chamber, the reaction gas mixture including a nitrogen compound and hydrogen gas;

wherein the reaction gas mixture is pressurized between 10 mTorr and 800 Torr, inclusive, and wherein the metallic nanotubes react with boron released from the solid boron-containing precursor and the nitrogen compound to form boron nitride nanotubes.

16. The method of claim 15, further including forming the metallic nanotubes by dewetting a metallic film having a thickness less than 100 nm at a temperature greater than 800° C.

17. The method of claim 15, wherein the boron nitride nanotubes have a mean diameter of between 0.5 nm and 100 nm, inclusive.

18. The method of claim 15, wherein the nitrogen compound comprises molecular nitrogen ($N_2$).

19. The method of claim 15, wherein the nitrogen compound comprises ammonia ($NH_3$).

20. The method of claim 15, wherein the reaction gas mixture includes a concentration of between 0.01% and 25% of hydrogen gas ($H_2$).

21. The method of claim 15, wherein the reaction gas mixture includes an inert gas and wherein the reaction gas mixture is maintained at atmospheric pressure.

22. The method of claim 15, wherein the solid boron-containing precursor is supported above the metallic nanoparticles.

23. The method of claim 15, wherein the solid boron-containing precursor is supported below the metallic nanoparticles.

24. The method of claim 15, wherein the solid boron-containing precursor is supported laterally adjacent to the metallic nanoparticles.

25. The method of claim 15, wherein the reaction mixture includes a ratio of a partial pressure of nitrogen and a partial pressure of hydrogen of at least 30.

* * * * *